United States Patent [19]
Simon

[11] 3,969,666
[45] July 13, 1976

[54] UNIVERSAL IMPEDANCE TEST LOAD
[75] Inventor: Louis W. Simon, Fort Mitchell, Ky.
[73] Assignee: Cincinnati Electronics Corporation, Cincinnati, Ohio
[22] Filed: Dec. 26, 1972
[21] Appl. No.: 317,945

Related U.S. Application Data
[63] Continuation-in-part of Ser. No. 166,712, July 28, 1971, abandoned.

[52] U.S. Cl. .................................. 323/74; 323/76; 323/77; 323/80; 324/57 R
[51] Int. Cl.² ........................................ G01R 1/20
[58] Field of Search .................. 323/63, 64, 65, 66, 323/74, 76, 77, 80; 331/81 R, 81 A; 334/14, 65

[56] References Cited
UNITED STATES PATENTS
1,506,374  8/1924  Lincoln ................................. 323/74
2,997,631  8/1961  Moakler ........................... 323/77 X FOREIGN PATENTS OR APPLICATIONS
224,081  10/1942  Switzerland ........................... 334/65

Primary Examiner—A. D. Pellinen
Attorney, Agent, or Firm—Lowe, King, Price & Markva

[57] ABSTRACT

The test load includes a T-type resistive attenuator, the elements being variable in unison, cascaded with switch-selected series or parallel adjustable or variable reactive elements. The combination permits setting noninteractively and independently the magnitude and the angle of the voltage reflection coefficient.

5 Claims, 3 Drawing Figures

UNIVERSAL IMPEDANCE TEST LOAD

The present application is a continuation-in-part of my U.S. patent application, Ser. No. 166,712 filed July 28, 1971, now abandoned, entitled "Universal Impedance Test Load," and assigned to the same assignee, as the present application and invention.

BACKGROUND OF THE INVENTION

Research, development and design work frequently involves a simulation of complex load impedance conditions for amplifiers, transmitters, various types of detectors, and other electronic equipment. Conventional practice involves the setting up of specific load impedances. This practice is subject to the disadvantage and limitation that each impedance is useful only at a single frequency or condition of match. While it has long been desirable to provide a variable test load, analogous to component substitution boxes, the complex nature of the devices previously known has discouraged manufacture. The present invention solved this problem and it presents a simple, economical and universal impedance test load.

A primary object of the invention is to provide a test load having wide ranges of frequency and impedance.

Another object of the invention is to provide a variable test load of high power handling capability.

BRIEF DESCRIPTION OF THE DRAWINGS

For a better understanding of the invention, together with other objects, advantages and capabilities thereof, reference is made to the following description of the accompanying drawings, in which.

DETAILED DESCRIPTION OF THE INVENTION

Figure 1:
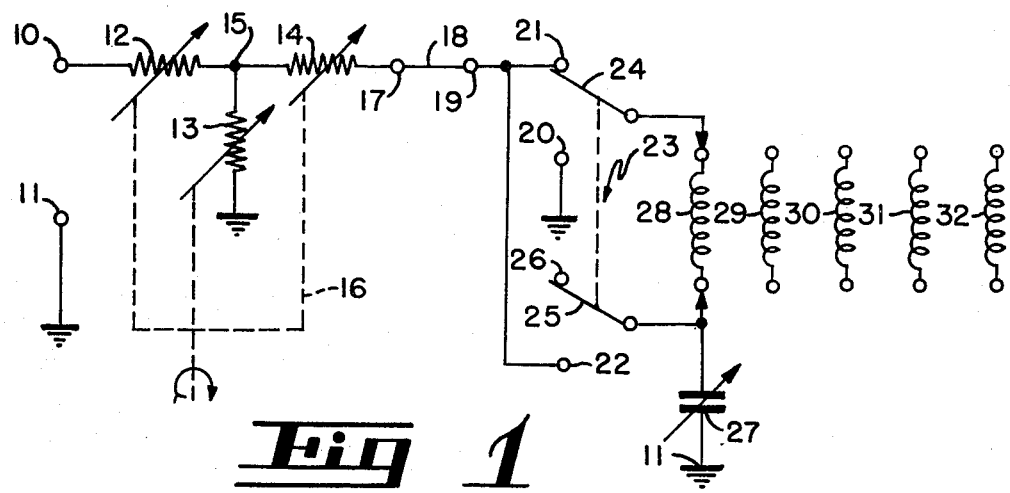
FIG. 1 is a circuit schematic of a preferred form of universal impedance test load in accordance with the invention.
Figure 2:
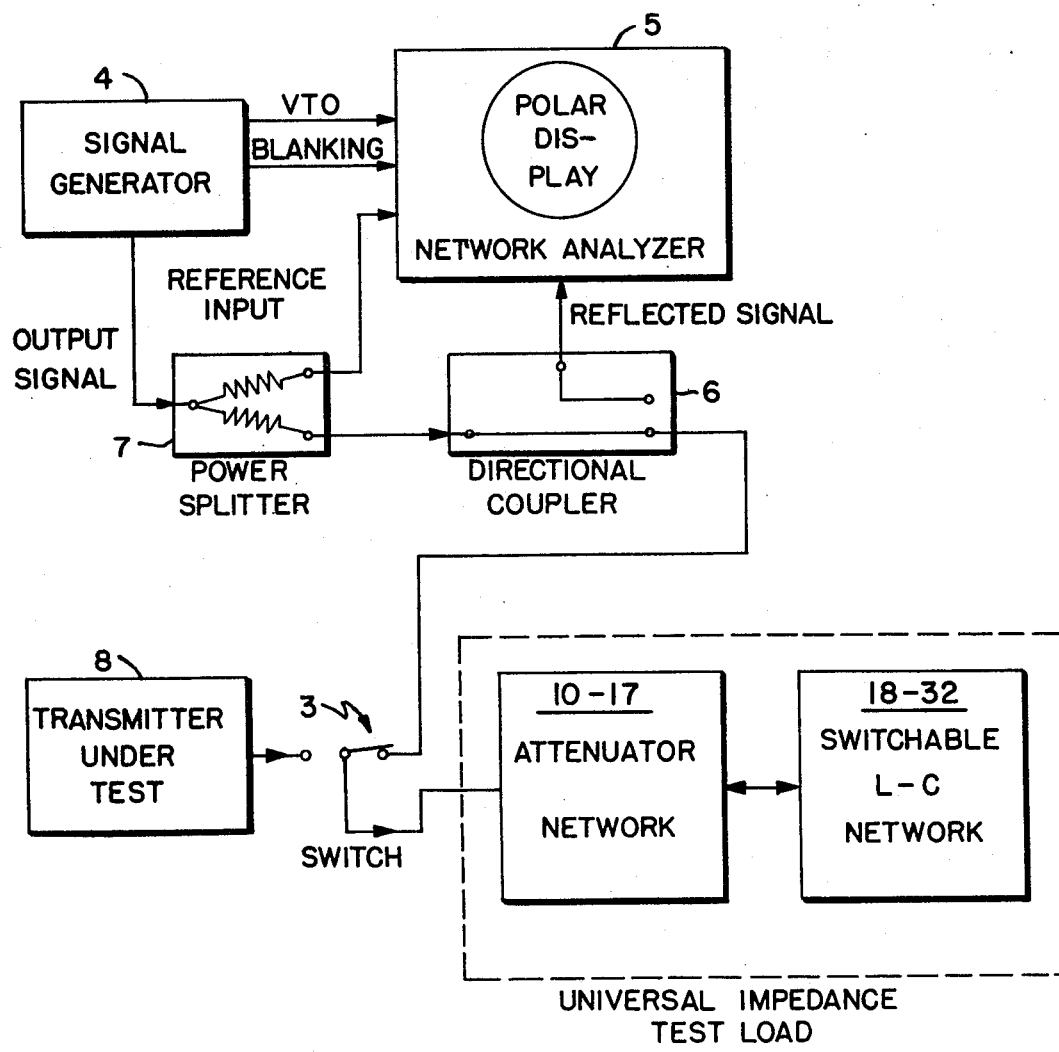
FIG. 2 is a block diagram of a test set-up including a transmitter under test and a test load per the invention.

Reference is first made to FIG. 2 in describing a typical environment in which the test load of FIG. 1, according to the invention, is used. The universal impedance test load of FIG. 2 comprises an attenuator network and a switchable inductance-capacitance network, in combination. The attenuator network 10-17 of FIG. 2 comprises the elements numbered 10-17 inclusive in FIG. 1. The switchable L-C network of FIG. 2 comprises the elements numbered 18-32 inclusive. The FIG. 2 set-up comprises a transmitter 8 which is to be tested for performance as it works into a load of specific real and imaginary impedance parameters, as a function of frequency.

Let it be assumed that the universal impedance test load should be adjusted to provide a load of 50 ohms at a predetermined frequency F. In such case a signal generator 4 is set to the frequency F. This generator provides an output signal which works into a power splitter 7 having outputs coupled to network analyzer 5 and the input of the universal impedance test load, via directional coupler 6 and the righthand contact of switch 3, symbolically shown. The signal generator 4 has video trigger and blanking outputs into the network analyzer 5.

The following well known units, readily available on the market, are used:

| | |
|---|---|
| Signal Generator 4 | Hewlett Packard Model 8601A |
| Network Analyzer 5 | Hewlett Packard Model 8407A |
| Directional Coupler 6 | Hewlett Packard Model 8721A |
| Power Splitter 7 | Hewlett Packard Model 11652-60009 |

The desired impedance of 50 ohms is plotted on the display of the network analyzer 5. This can be accomplished by a pencil mark on a plastic Smith chart overlay. The impedance value of the universal impedance test load is displayed as a lighted dot on unit 5. This dot is brought into coincidence with the grease pencil mark by the following three-step procedure:

Step 1: If the desired impedance lies initially in the left half plane ($|Z| < 50$ ohm), position the L-C switch 23 in network 18-32 to "series;" if it lies on the right side of the vertical axis dividing the display, position the L-C switch 23 to "parallel."

Step 2: Note the distance the grease pencil mark lies radially outward from the center of the display. Rotate the control of attenuator network 10-17 until the bright spot lies at the same radial distance as the grease pencil mark.

Step 3: Adjust one or both of the "inductor" and "capacitor" controls to move the spot in a circular arc until it coincides with the fixed mark. Fine correction of the attenuator and/or the inductor/capacitor may be necessary.

With the test load now properly set, switch 3 can be swung to the left and transmitter 8 checked at the frequency of interest. The procedure can be repeated for as many test frequencies as desired. Alternatively, a chart can be made showing the knob and switch settings of the test load as a function of frequency. Then using this chart, the transmitter can be tested at these frequencies by setting of the adjustment to the designated values. It is to be understood that switch 3 is included only for pictorial purposes. In actual practice, there would normally be a single coaxial cable used to connect the test load to either directional coupler 6 or transmitter 8. The operator would achieve the switching function by physically coupling the cable to either the transmitter or the impedance checking instruments.

It should be noted that the preferred embodiment of the invention uses passive elements: simple resistance, capacitance, inductive and switching components. The device under test (not shown) is coupled to the input terminals 10 and 11 of the test load. The test load comprises a three-ganged set of variable resistances 12, 13 and 14, electrically interconnected at 15. The resistances are variable in unison as is symbolically indicated by the ganging legend 16. That is, starting at input terminal 10, the attenuator comprises a series variable resistor 12, a shunt variable resistor 13, and a series variable resistor 14 which terminates at attenuator output terminal 17. Terminal 17 is connected by conductor 18 to terminal 19. Please note that input terminal 11 and terminal 20 are common, being connected to ground.

Terminal 19 is connected to fixed contacts 21 and 22 of a double pole, double throw switch 23. This double throw, double pole switch couples moving contact or blade 24 to contact 21 and moving contact or blade 25 to open circuited contact 26 in order to connect the inductance and capacitance parameters as a series combination in shunt between output terminal 21 and ground 11. In the alternative, the switch 23 connects moving contact 24 to grounded terminal 20 and moving contact 25 to output terminal 22 (effectively to 17, 18, 19, 21) in order to connect the inductive and capacitive parameters as a parallel combination in shunt across the output of the attenuator.

The capacitive reactance parameter comprises a variable capacitor 27 connected between blade 25 and ground 11. The inductive reactance parameter comprises any one of a plurality of discrete inductances 28, 29, 30, 31 or 32 selectively connected between blades 24 and 25.

From the foregoing it will be seen that the function of the switch 23 is to connect either the junction of the inductance and capacitance parameters to the output 17 of the attenuator, via 25, 22, 19, 18, so as to parallel the selected inductance and the capacitance 27, or to connect the series combination of selected discrete inductance and capacitance 27 in shunt across the output of the attenuator, via 24, 21, 19, 18, 17. In the parallel case one terminal of the selected inductance is grounded via 24, 20. In the series case, the junction of the inductance and capacitance elements is open circuited.

OPERATION OF THE INVENTION

Figure 3:
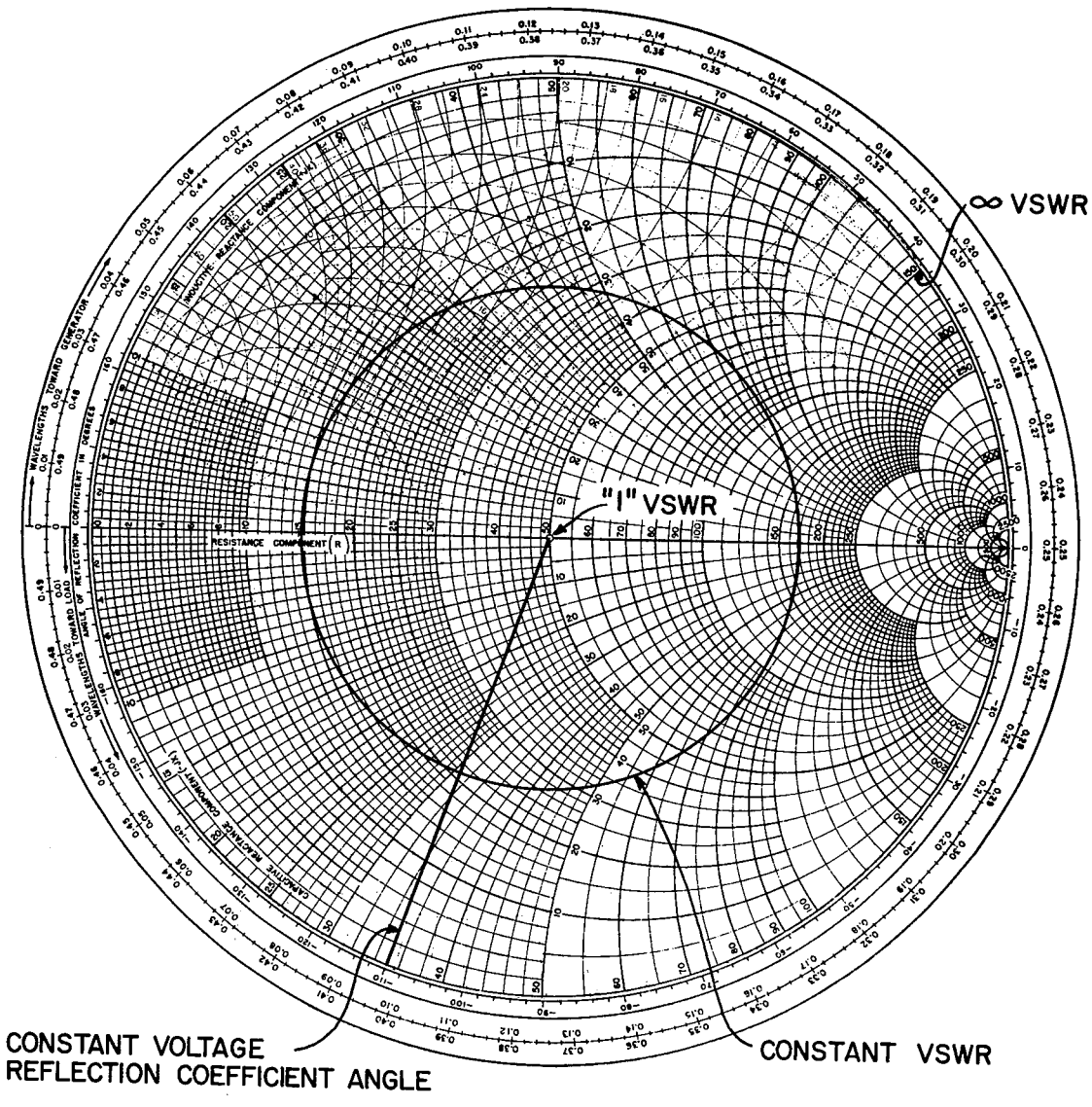
FIG. 3 is a Smith chart with graphs used in describing the operation and advantages of the invention.

Refer now to the Smith chart of FIG. 3. For purposes of discussion, let it be assumed that the conductor 18, between terminals 17 and 19, is removed. Let there be considered the impedance presented between terminal 19 and ground 11. The impedance available between these two points may be varied by adjustment of switch 23 to select either the series or the parallel combination of reactive parameters, by selection of any one of the discrete inductance elements and/or by variation of capacitance 27. When switch 23 selects the series connection of the reactances, variation of capacitance 27 provides impedances from the maximum capacitive reactance through series resonance to the maximum inductive reactance. When the switch is in the position at which it connects the reactive parameters in parallel, then variation of capacitance 27 provides admittances from the maximum capacitive susceptance through parallel resonance to the maximum inductive susceptance. The particular value of the discrete inductance 28, 29, 30, 31, 32 selected is based on the operating frequency and the maximum or minimum inductive reactance or susceptance which is desired. The Smith chart impedances available are therefore defined by the ∞ voltage standing wave (VSWR) circle, the ∞ voltage standing wave ratio circle shown in FIG. 3 being illustrative.

Now let the conductor 18 be replaced, for purposes of further description of operation. The attenuator 13, 14, 15 provides a means to introduce resistive impedance parameters at the input terminals 10, 11. After selection of the inductance and capacitance parameters variation of the attenuator from zero to infinite attenuation causes the impedance appearing at the input terminals 10, 11 to vary over the range from pure reactance to pure resistance. When attenuation is varied the locus of impedances is a radial straight line. Therefore the invention provides, through variation of attenuation, a method for maintaining constant the angle of the voltage reflection coefficient while varying its magnitude.

It has been seen that when attenuation is maintained constant, variation of capacitance produces on the Smith chart a circle of constant voltage reflection coefficient. The input voltage standing wave ratio is uniquely related to the magnitude of the voltage reflection coefficient. Therefore the Smith chart locus of impedance, for a variation of capacitance, is also a circle of constant VSWR. It follows from the foregoing that not only can impedances on the Smith chart be presented at the input terminals 10, 11, but also voltage standing wave ratio circles of varying value.

The parameters of the resistive elements of the attenuator depend on its characteristic impedance as well as the range desired. In one successful embodiment of the invention the characteristic impedance was 50 ohms and a suitable range of attenuation was zero to 15 decibels. This permits a range of VSWR from infinity to 1.1.

Reference is made to pages 10.3–6 of *Reference Data for Radio Engineers*, 5th Ed., (New York: Howard W. Sams & Co., Inc. 1969), for design information relative to the variable attenuator per se. The range of capacitance of the element 27 and the number and values of discrete inductors depend on the desired frequency and impedance range of the device.

In the embodiment referred to above, the objectives were achieved over a frequency range of 1 to 10 megahertz. At 1 megahertz the VSWR range was from 1 to 1 to 25 to 1. At 10 megahertz the VSWR range was from 1 to 1 to 10 to 1. These ranges are capable of extension by component improvements.

Having described my invention in detail, I claim:

1. A universal test load apparatus having independently adjustable reflection coefficient magnitude and angle as seen from a pair of input terminals comprising:
   1. a variable attenuator coupled to both of the input terminals and having a pair of output terminals, means for varying the attenuation of said attenuator while maintaining a substantially constant characteristic impedance between both said input and output terminals; and
   2. variable reactance means connected across said attenuator output terminals, said variable reactance means comprising a variable capacitive reactance, an inductive reactance, and switch means for selectively connecting the capacitive reactance and the inductive reactance in series with each other or in parallel with each other, the series or parallel connections being selected dependent on said reflection coefficient angle.

2. The apparatus of claim 1 wherein said attenuator comprises three variable resistive elements, one of said resistive elements being connected in series with one of said input terminals and one of said resistive elements being connected in shunt with said input terminals, said means for varying the attenuation of the attenuator including means for simultaneously varying the three resistive elements.

3. The apparatus of claim 1 wherein said inductive reactance comprises a plurality of discrete inductive reactances in combination with additional switch means for selecting one of the plurality of inductive reactances.

4. A method of setting to predetermined values the magnitude and angle of the reflection coefficient of a test load as seen from a pair of test load input terminals, said test load including a constant characteristic impedance variable attenuator coupled to said input terminals, said attenuator having a pair of output terminals, a variable reactance device connected across said output terminals, said method comprising:
1. adjusting the reactance of the variable reactance device to a predetermined value related solely to the predetermined angle of the reflection coefficient while maintaining the characteristic impedance of the attenuator at a constant value; and
2. adjusting the attenuation of the variable attenuator to a predetermined value related solely to the predetermined magnitude of the reflection coefficient while maintaining the characteristic impedance of the attenuator at the constant value.

5. The method of claim 4, wherein the variable reactance device comprises an inductive reactance and a capacitive reactance and further including the step of connecting the inductive and capacitive reactances in series when said predetermined angle is greater in absolute value than 90° and connecting the inductive and capacitive reactances in parallel when said predetermined angle is less in absolute value than 90°.

* * * * *